(12) United States Patent
Lee et al.

(10) Patent No.: US 7,947,906 B2
(45) Date of Patent: May 24, 2011

(54) PRINTED CIRCUIT BOARD AND MANUFACTURING METHOD THEREOF

(75) Inventors: Doo-Hwan Lee, Yongin-si (KR);
Je-Gwang Yoo, Yongin-si (KR);
Seung-Gu Kim, Chungcheongbuk-do (KR); Jae-Kul Lee, Seoul (KR);
Moon-Il Kim, Daeleon (KR);
Hyung-Tae Kim, Ansan-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 965 days.

(21) Appl. No.: 11/528,322

(22) Filed: Sep. 28, 2006

(65) Prior Publication Data
US 2007/0074900 A1      Apr. 5, 2007

(30) Foreign Application Priority Data

Oct. 4, 2005 (KR) .................. 10-2005-0093109

(51) Int. Cl.
*H05K 3/02* (2006.01)
*H05K 1/00* (2006.01)
(52) U.S. Cl. .................................. 174/252; 29/847
(58) Field of Classification Search .......... 361/761–764; 174/252; 29/847
See application file for complete search history.

(56) References Cited

U.S. PATENT DOCUMENTS

| | | | | |
|---|---|---|---|---|
| 4,544,989 A | * | 10/1985 | Nakabu et al. | 361/764 |
| 4,793,903 A | * | 12/1988 | Holmquist et al. | 205/213 |
| 5,066,368 A | * | 11/1991 | Pasqualoni et al. | 205/112 |
| 5,578,869 A | * | 11/1996 | Hoffman et al. | 257/691 |
| 5,629,835 A | * | 5/1997 | Mahulikar et al. | 361/719 |
| 5,745,984 A | * | 5/1998 | Cole et al. | 29/834 |
| 6,998,533 B2 | * | 2/2006 | De Samber et al. | 174/521 |
| 2008/0079349 A1 | * | 4/2008 | Miyazaki et al. | 313/495 |

FOREIGN PATENT DOCUMENTS

| | | | |
|---|---|---|---|
| JP | 2-82691 A | | 3/1990 |
| JP | 9-199518 A | | 7/1997 |
| JP | 10-110147 | * | 4/1998 |
| JP | 11-163212 A | | 6/1999 |
| JP | 2003-347741 | | 12/2003 |
| JP | 2005-150185 A | | 6/2005 |

OTHER PUBLICATIONS

Machine Translation of JP 10-110147 (Apr. 1998).*
Japanese Office Action issued on Jan. 19, 2009 in corresponding Japanese Patent Application 2006-270247.

* cited by examiner

*Primary Examiner* — Jeremy C Norris (57) ABSTRACT

A multi-layer printed circuit board and a method of manufacturing the multi-layer printed circuit board using a metal substrate as a core member and having an electronic component embedded in the metal substrate, the method including anodizing the metal substrate such that an anodic oxide layer is formed on upper and lower sides of the metal substrate, respectively; forming an inner layer circuit on upper and lower anodic oxide layers, respectively; etching the metal substrate to form a cavity in correspondence with a position where the electronic component is to be embedded; mounting the electronic component in the cavity with a chip bond adhesive; and forming an outer layer circuit on upper and lower sides of the metal substrate, respectively, such that a multi-layer circuit is formed.

15 Claims, 6 Drawing Sheets

Figure 1

- PRIOR ART -

PRINTED CIRCUIT BOARD AND MANUFACTURING METHOD THEREOF

CROSS-REFERENCE TO RELATED APPLICATIONS

This application claims the benefit of Korean Patent Application No. 2005-0093109 filed with the Korean Intellectual Property Office on Oct. 4, 2005, the disclosure of which is incorporated herein by reference in its entirety.

BACKGROUND

1. Technical Field

The present invention relates to a printed circuit board, more particularly to a printed circuit board having an embedded electronic component and manufacturing method thereof.

2. Description of the Related Art

As a part of next-generation multi-functional miniature package technology, attention is being focused on the development of a printed circuit board having embedded electronic components. Along with the advantages of multi-functionality and miniaturization, a printed circuit board having embedded electronic components also allows, to a degree, more sophisticated functionalities, as the wiring distance can be minimized in a high-frequency range of 100 MHz or higher, and in some cases, problems in reliability may be resolved for connections between components using wire bonding or solder balls in an FC (flexible circuit board) or a BGA (ball grid array).

However, in a conventional printed circuit board having embedded electronic components, there is a high probability that problems in heat release due to embedding electronic components such as high-density IC's, or problems such as delamination, etc., will affect the yield, and there are difficulties in the overall process that raise the costs of manufacture. Therefore, a technology is required which provides stiffness for minimizing warpage in thin printed circuit boards, and which provides improvements in heat-releasing property.

Examples of prior art related to the printed circuit board having embedded electronic components include, first, a method of utilizing tape and a molding compound for embedding the electronic components. In this invention, liquid epoxy material is utilized in embedding the components after etching an insulation substrate, so as to minimize the thermal and mechanical impact caused by differences in the coefficients of thermal expansion and the coefficients of elasticity between the embedded electronic component, such as IC's, and the substrate. However, it is limited in that the stiffness and heat-releasing property of the substrate itself are unchanged.

A second example includes an invention of using a metal substrate for a core member of the printed circuit board and forming resin layers as insulation layers, to improve the mechanical and thermal properties of the board. However, this invention is not of a structure that enables embedding electronic components in the core member, and the problem of delamination remains a possibility.

A third example includes an invention in which a metal substrate is used as a core member, with an insulation layer on one side of the metal substrate and an electronic component embedded in the insulation layer. However, this invention is not of a structure that enables embedding electronic components in the core member, so that the thickness of the printed circuit board is increased by the thickness of the insulation layer necessary for embedding electronic components.

SUMMARY

The present invention aims to provide a printed circuit board and manufacturing method thereof, for embedding an electronic component in a core member, which improve the stiffness and heat-releasing property of the core member, provide superior adhesion between the core member and the insulation layer, and allow stable embedding of the electronic component.

One aspect of the invention provides a method of manufacturing a printed circuit board, which uses a metal substrate as a core member and has an electronic component embedded in the metal substrate, mainly comprising: (a) anodizing at least one surface of the metal substrate to form at least one insulation layer, (b) forming an inner layer circuit on the at least one insulation layer, (d) placing chip bond adhesive in correspondence with a position where the electronic component is to be embedded and mounting the electronic component, and (e) forming an outer layer circuit in correspondence with a position where the inner layer circuit is formed and with positions of the electrodes of the electronic component.

The method may further comprise an operation (c) of etching the metal substrate to form a cavity in correspondence with a position where the electronic component is to be embedded, between the operation (b) of forming an inner layer circuit on the at least one insulation layer and the operation (d) of placing chip bond adhesive in correspondence with a position where the electronic component is to be embedded and mounting the electronic component.

It may be preferable that the metal substrate include a material which can be made electrically insulating, and may include at least one of aluminum (Al), magnesium (Mg), and titanium (Ti). The operation (c), of etching the metal substrate to form a cavity in correspondence with a position where the electronic component is to be embedded, may be performed by wet etching.

The method may further comprise cleaning the at least one surface of the metal substrate, before the operation (a) of anodizing at least one surface of the metal substrate to form at least one insulation layer. Chip bond adhesive, nonconductive paste, or a die-attach film, etc., may be used in mounting the chip, where it may be preferable, when using chip bond adhesive or nonconductive paste, etc., that the material be high in thixotropy. The chip bond adhesive may include $SiO_2$ as a filler.

Meanwhile, the chip bond adhesive described in the present disclosure is not limited to a particular product, but rather refers generally to a material placed for embedding or mounting an electronic component in/on the substrate. The operation of placing chip bond adhesive for mounting the electronic component may comprise heating the metal substrate to harden the chip bond adhesive, etc.

Another aspect of the present invention provides a printed circuit board having an embedded electronic component, comprising a metal substrate, an anodic oxide layer formed on at least one surface of the metal substrate, an inner layer circuit formed on the anodic oxide layer, an electronic component joined to the metal substrate by interposed chip bond adhesive, and an outer layer circuit formed on the metal substrate in correspondence with a position where the inner layer circuit is formed and with positions of electrodes of the electronic component.

It may be preferable that the printed circuit board further comprise a cavity formed by removing a portion of the metal substrate, with the electronic component mounted in the cavity. The cavity may be formed by wet etching the metal substrate.

The metal substrate may include a material which can be made electrically insulating, and may preferably include at least one of aluminum (Al), magnesium (Mg), and titanium (Ti). It may be preferable that the chip bond adhesive include a thixotropic material, and may include $SiO_2$ as a filler. The electronic component may be joined by heating the metal substrate to harden the chip bond adhesive.

Additional aspects and advantages of the present invention will be set forth in part in the description which follows, and in part will be obvious from the description, or may be learned by practice of the invention.

DETAILED DESCRIPTION

Embodiments of the printed circuit board and manufacturing method thereof according to the present invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
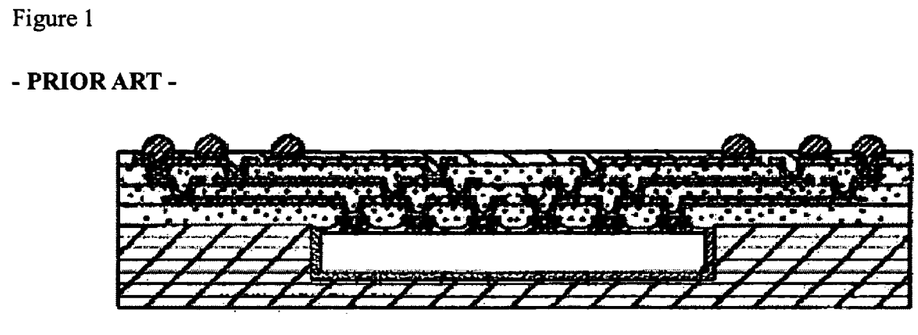
FIG. 1 is a cross-sectional view of a printed circuit board having an embedded electronic component according to prior art.
Figure 2:
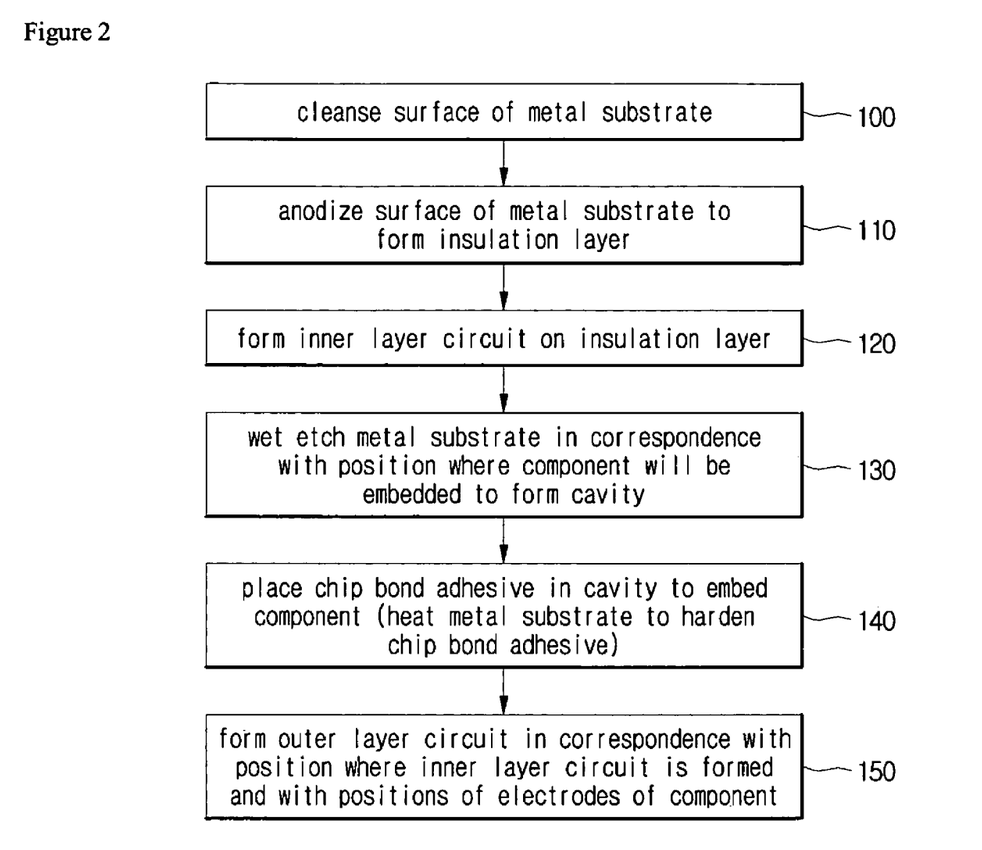
FIG. 2 is a flowchart illustrating a method of manufacturing a printed circuit board having an embedded electronic component according to an embodiment of the present invention.

FIG. 2 is a flowchart illustrating a method of manufacturing a printed circuit board having an embedded electronic component according to an embodiment of the present invention.

The present invention is characterized by using a metal substrate as a core member, so as to minimize the adding of new members to a method of manufacturing a conventional printed circuit board, maintain stiffness even with a lower thickness, and promote high efficiency in heat-releasing property.

In order to implement such a structure, the printed circuit board is manufactured by first embedding or mounting an active or a passive component, etc., having the form of a chip, in/on a metal substrate, i.e. the core member, and afterwards forming outer layers by stacking processes and forming via holes to electrically connect the electrical component with the circuits of the board.

Compared to substrates of other materials, a metal substrate is superior in stiffness and thermal conduction, etc., and may be used for wet processes, whereby reductions in manufacturing costs may be anticipated. However, there is a need to control the occurrence of undesired electrical conduction through the metal substrate, which may be resolved through insulation treatment applied on the surfaces or even the inside by methods such as anodizing.

That is, in manufacturing a printed circuit board, according to an embodiment of the invention, which uses a metal substrate as the core member with an electrical component embedded within the metal substrate, first, the surfaces of the metal substrate are anodized to form insulation layers (110).

Metal is a material generally superior in stiffness and thermal conductivity, and it is preferable that the metal be a material which can be made electrically insulating. Such metal materials include aluminum (Al), magnesium (Mg), and titanium (Ti), etc., although aluminum is typically used. A commercialized metal material may also be used, in which aluminum surfaces are anodized.

Anodizing is a method of surface treatment widely used in construction materials, telecommunication devices, optical devices, ornaments, and vehicle components, etc., with which a thin oxide layer is formed on the surface of a metal to protect the inside of the metal. It is used mainly with a metal such as aluminum (Al), magnesium (Mg), and titanium (Ti), etc., which reacts very actively with oxygen to form an oxide layer on the surface by itself.

Anodizing is a method of accelerating oxidation to artificially create an oxide layer of uniform thickness, by allowing the metal to act as an anode in a solution such as sulfuric acid, etc. An electrical current is applied with the metal to be plated, such as aluminum, etc., serving as the anode, so that the aluminum surface is oxidized by the oxygen generated at the anode, to form a coating of aluminum oxide ($Al_2O_3$). This coating is a very strong, corrosion-resistant layer having porosity, and since it can be dyed into a variety of colors, anodizing treatment is often used not only for such practical reasons as corrosion resistance and durability, but also for aesthetic reasons.

Thus, before anodizing the surfaces of the metal substrate, it is desirable to cleanse the surfaces of the metal substrate (100) through degreasing and desmutting, etc., as preprocessing procedures.

However, the process for insulating the surfaces of the metal substrate according to embodiments of the invention is not necessarily limited to anodizing, and it is obvious that any surface treatment method, apparent to those skilled in the art, may be used that can form an insulation layer on a surface of the metal substrate.

Next, an inner layer circuit is formed on the insulation layer formed on each surface of the metal substrate (120). This is achieved by performing electroless plating on the surface of the insulation layer, forming a copper foil layer by electroplating, and forming a circuit pattern using a conventional method such as photolithography, etc.

Meanwhile, to form via holes for implementing electrical connection between circuit layers, the metal substrate may be perforated using a drill, etc., before the insulating of the metal substrate by anodizing, and then the circuit pattern may be formed by sequentially performing the anodizing, electroless plating, electroplating, and photolithography.

Next, a cavity is formed by etching the metal substrate in correspondence with the position where the electronic component is to be embedded (130). In embodiments of the invention, the electronic component is embedded in the core member to provide a thinner printed circuit board, and to this end, a portion of the metal substrate is removed to form a cavity, which is the space where the electronic component will be embedded. Here, the cavity is for adjusting the height of the substrate and the height of the electronic component, and in some cases, the procedure of forming the cavity may be omitted, proceeding instead with a SMT process utilizing the chip bond adhesive, etc., as described below.

As it is possible to perform wet etching on a typical metal material, the cavity mentioned above is formed by wet etching. However, the present invention is not limited to cases in which the cavity is formed by wet etching, and the cavity may be formed by other methods apparent to those skilled in the art, such as dry etching, etc., although dry etching incurs higher processing costs compared to wet etching. Therefore, using wet etching to form the cavity, in which the electronic component is to be embedded, in the metal substrate may be advantageous in terms of cost reduction.

Next, chip bond adhesive, etc., is placed in the cavity formed by etching a portion of the metal substrate or on the surface of the metal substrate to embed the electronic component (140). Here, it is obvious that nonconductive paste or a 'die attach film' may also be used besides chip bond adhesive. The chip bond adhesive, etc., joins the electronic component to the substrate such that they may move in a structurally integrated manner, and in the case of chip bond adhesive that has a certain degree of heat-releasing capability, it also performs the function heat transfer, such that heat generated at the electronic component is efficiently released through the metal substrate.

A typical chip bond adhesive uses an epoxy-based resin. After dispensing the chip bond adhesive in the cavity and positioning the electronic component thereon, heat is applied to the chip bond adhesive for hardening, whereby the electronic component is joined to the substrate.

Therefore, the thixotropy of the chip bond adhesive affects the alignment and position of the electronic component located on the chip bond adhesive. In embodiments of the invention, a chip bond adhesive high in thixotropy is used, so that the thickness of the chip bond adhesive positioned between the electronic component and the substrate is uniform, and the electronic component is stably aligned in a desired position.

While it may be preferable, when the material of the chip bond adhesive, etc., used for embedding or mounting (SMT) the electronic component is close to a liquid, that a material having high thixotropy (high in index value) be utilized, caution is required as a mechanical impact may be applied on the electronic component during the mounting (SMT) due to its surface energy.

In order to increase the thixotropy, $SiO_2$ is added as a filler to the conventional epoxy-based resin, but the present invention is not necessarily limited to using chip bond adhesive that includes a $SiO_2$ filler, and it is obvious that any composition may be used, within a scope apparent to those skilled in the art, that provides high thixotropy.

After dispensing the chip bond adhesive in the cavity and positioning the electronic component, heat is applied to the chip bond adhesive for hardening, whereby the electronic component is secured to the substrate. Since, in embodiments of the invention, a metal substrate is used as the core member which is superior in thermal conduction, the chip bond adhesive may be hardened in a more convenient manner, compared to prior art, by applying heat to the metal substrate.

That is, the metal substrate according to embodiments of the invention may be utilized in positioning the electronic component using chip bond adhesive. Specifically, since heat may readily be transferred through the metal substrate not only after positioning the electronic component on the chip bond adhesive but also, if necessary, before dispensing the chip bond adhesive and positioning the electronic component, the extent to which the chip bond adhesive is hardened can be adjusted, for an effect of improving the positioning of the electronic component.

Meanwhile, when using a chip bond adhesive having superior thixotropy as described above, a hardening agent may be used, within a scope apparent to those skilled in the art, to facilitate the hardening by heating.

By thus heating the metal substrate to harden the chip bond adhesive after positioning the electronic component using a highly thixotropic chip bond adhesive, the positioning process is improved for the electronic component embedded in the printed circuit board.

Lastly, an outer layer circuit is formed in correspondence with the position where the inner layer circuit is formed and with the positions of the electrodes of the electronic component (150). That is, an ABF (Ajinomoto build-up film), etc., is stacked, or prepreg (PPG) and copper (Cu) or RCC (rubber coated copper), etc., are/is stacked, on at least one surface of the metal substrate, having via holes and inner layer circuits and having the electronic component embedded in the cavity thereof, after which an additive or subtractive method is applied to form outer layer circuits. The above procedures are repeated to stack a plurality of outer layer circuits.

Figure 3:
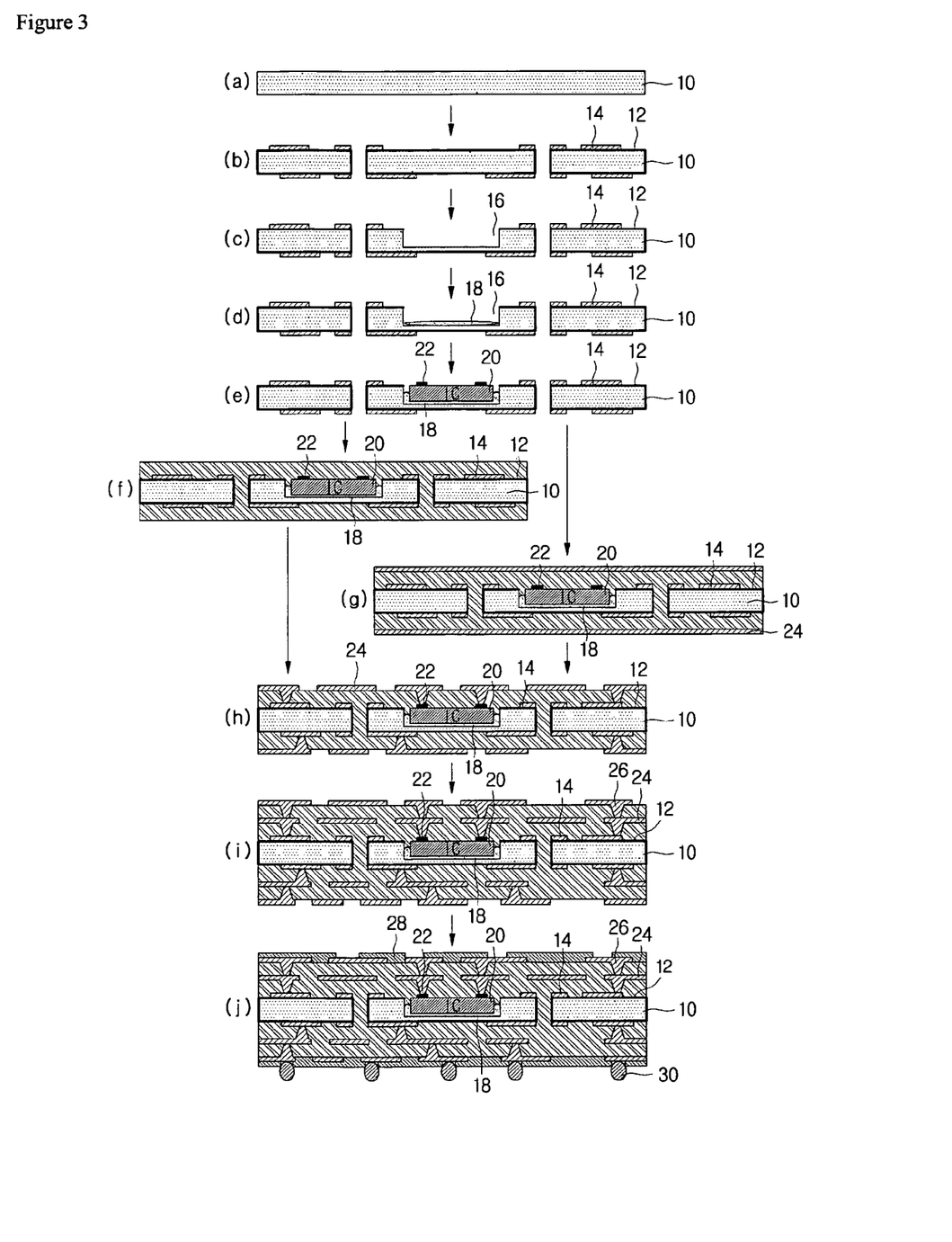
FIG. 3 is a flow diagram illustrating a process of manufacturing a printed circuit board having an embedded electronic component according to an embodiment of the present invention.

FIG. 3 is a flow diagram illustrating a process of manufacturing a printed circuit board having an embedded electronic component according to an embodiment of the present invention. In FIG. 3 are illustrated a metal substrate 10, insulation layers 12, inner layer circuits 14, a cavity 16, chip bond adhesive 18, an electronic component 20, electrodes 22, first outer layer circuits 24, second outer layer circuits 26, solder resist 28, and solder balls 30.

In a manufacturing process for a printed circuit board having an embedded electronic component according to an embodiment of the invention, a metal substrate 10, which is superior in stiffness and thermal conductivity, and which can be made electrically insulating, is used as the core member, as in (a) of FIG. 3.

The portions where via holes are to be formed are perforated with a drill as in (b) of FIG. 3, and after forming the insulation layers 12 on the surfaces by anodizing, etc., to control the electrical conductivity of the metal substrate 10, inner layer circuits 14 are formed by applying such procedures as electroless plating, electroplating, and photolithography, etc.

As in (c) of FIG. 3, the position where the electronic component 20 will be embedded is etched to form the cavity 16. While either dry or wet processes may be applied for the method of etching, wet etching is more advantageous in terms of processing costs.

As in (d) of FIG. 3, chip bond adhesive 18 is dispensed in the cavity 16 formed by removing a portion of the metal substrate 10 by etching. The chip bond adhesive 18 releases the heat generated at the electronic component 20 to the substrate and secures the electronic component 20 to the substrate. An epoxy-based resin is typically used.

As in (e) of FIG. 3, electronic component 20 having the form of a chip, such as an IC, is positioned on the chip bond adhesive 18 dispensed in the cavity 16, and the metal substrate 10 is heated, so that the chip bond adhesive 18 is hardened and the electronic component 20 is secured to the substrate. In securing the electronic component 20 by hardening the chip bond adhesive 18, it is advantageous to use a chip bond adhesive 18 high in thixotropy for improving the positioning of the electronic component 20.

An ABF, etc., is stacked as in (f) of FIG. 3, or prepreg (PPG) and copper (Cu) or RCC (rubber coated copper) are/is stacked as in (g) of FIG. 3, so that the circuit pattern forming process described below may be applied.

As in (h) of FIG. 3, first outer layer circuits 24 are formed by applying a stacking method such as an SAP (semi-additive process) or an MSAP (modified semi-additive process), etc., to the ABF, or by applying a subtractive method to the copper foil layer. When necessary, the methods are repeated to stack second outer layer circuits 26, as in (i) of FIG. 3. In this manner, multi-layer circuits may be formed.

To form a BGA (ball grid array), portions of the solder resist 28, which forms the outermost surface of the printed circuit board having one or a plurality of outer layer circuits, are opened and solder balls 30 are attached, as in (j) of FIG. 3. While FIG. 3 illustrates the case where the electronic component 20 is arranged to face upwards, it is apparent to those skilled in the art that the electronic component 20 may conversely be arranged to face downwards toward the solder balls 30.

Figure 4:
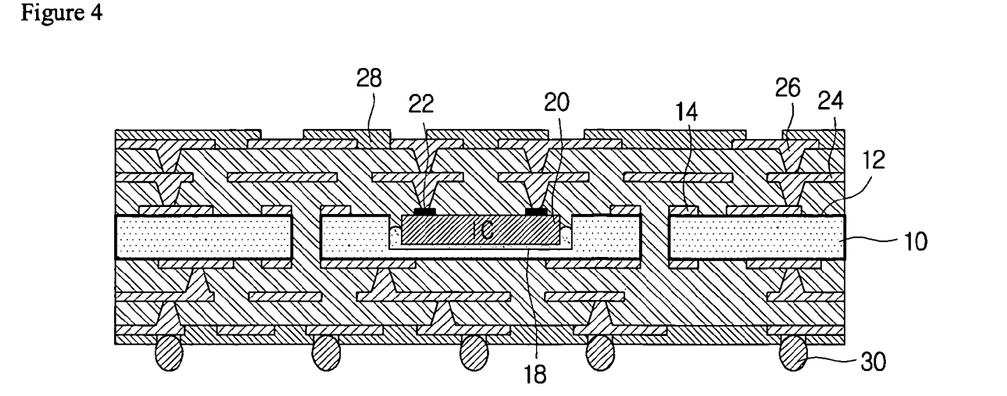
FIG. 4 is a cross-sectional view of a printed circuit board having an embedded electronic component according to a first disclosed embodiment of the present invention.
Figure 5:
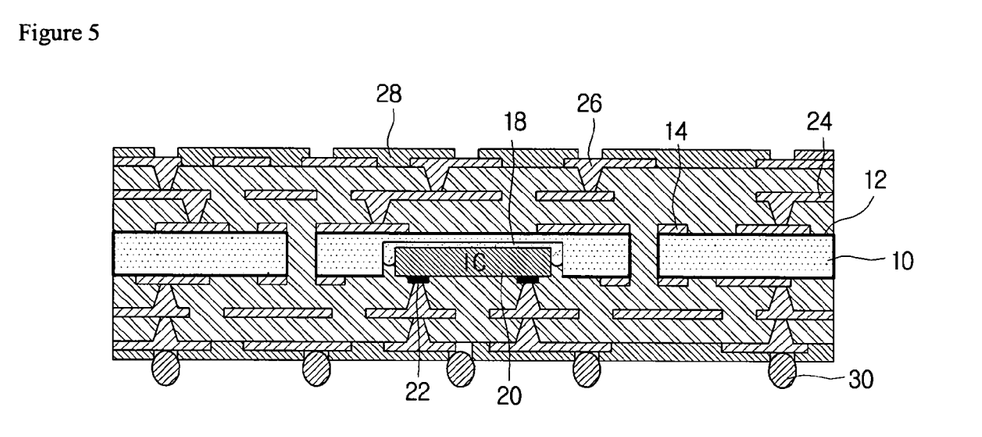
FIG. 5 is a cross-sectional view of a printed circuit board having an embedded electronic component according to a second disclosed embodiment of the present invention.
Figure 6:
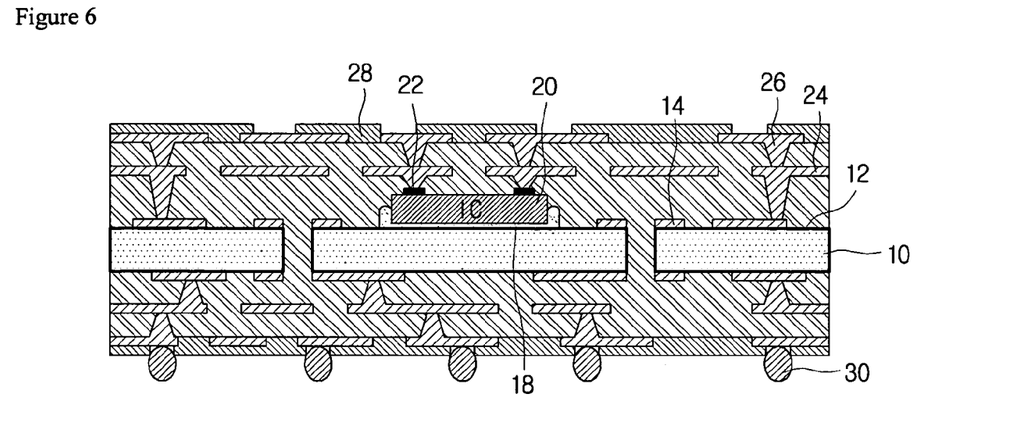
FIG. 6 is a cross-sectional view of a printed circuit board having an embedded electronic component according to a third disclosed embodiment of the present invention.

FIG. 4 is a cross-sectional view of a printed circuit board having an embedded electronic component according to a first disclosed embodiment of the present invention, FIG. 5 is a cross-sectional view of a printed circuit board having an embedded electronic component according to a second disclosed embodiment of the present invention, and FIG. 6 is a cross-sectional view of a printed circuit board having an embedded electronic component according to a third disclosed embodiment of the present invention. In FIGS. 4 to 6 are illustrated a metal substrate 10, insulation layers 12, inner layer circuits 14, a cavity 16, chip bond adhesive 18, an electronic component 20, electrodes 22, first outer layer circuits 24, second outer layer circuits 26, solder resist 28, and solder balls 30.

The printed circuit board having an embedded electronic component according to an embodiment of the invention is manufactured by the process described above, and thus mainly comprises a metal substrate 10, insulation layers 12 formed on the surfaces of the metal substrate 10, inner layer circuits 14 stacked on the insulation layers 12, a cavity 16 formed as a portion of the metal substrate 10 is removed, and an electronic component 20 embedded in the cavity 16.

It is desirable that the metal substrate 10 be a material that is superior in stiffness and thermal conductivity, and which can be made electrically insulating, to control the electrical conductivity through the metal substrate 10. Typically, aluminum (Al), magnesium (Mg), or titanium (Ti), etc., is used.

The insulation layers 12, for making the surfaces of the metal substrate 10 electrically insulating to allow control of the electrical conductivity, are formed by anodizing, as described above, into anodic oxide layers. An anodic oxide layer has a high degree of surface roughness due to its many pores, a result of which is that its adhesion to the plating layer stacked thereon is improved. Here, as the pores in the inside may later affect the reliability of the substrate, it is desirable that the pores be filled with epoxy, etc., after the treatment such as the anodizing, etc.

It is advantageous, in terms of processing costs, that the cavity 16 formed in the metal substrate 10 for embedding the electronic component 20 be formed by wet etching. To secure the electronic component 20 in the cavity 16 for embedding, chip bond adhesive 18 is placed in-between. Since the chip bond adhesive 18 performs the functions of releasing the heat generated in the electronic component 20 and positioning the electronic component 20, etc., it may be manufactured by adding a filler for increasing the heat-releasing property and thixotropy, such as $SiO_2$, etc., to an epoxy-based resin.

After dispensing the chip bond adhesive 18 in the cavity 16 and positioning the electronic component 20, the metal substrate 10 is heated, so that the chip bond adhesive 18 is hardened, and the electronic component 20 is secured to the substrate. Thus, the electronic component 20 is embedded in the substrate, such that the electronic component 20 and the substrate may move in a structurally integrated manner. Although the portion of the metal substrate 10 where the cavity 16 is formed may provide relatively less stiffness compared to other portions, this can be supplemented by embedding the electronic component 20.

By applying a conventional method of forming circuit patterns, such as a subtractive method, an MSAP (modified semi-additive process), or an SAP (semi-additive process), etc., in correspondence with the inner layer circuits 14 and the electrodes 22 of the electronic component 20, a plurality of outer layer circuits such as the first outer layer circuits 24 and second outer layer circuits 26, etc., are stacked to manufacture a multi-layer printed circuit board. When a BGA is to be formed, solder balls 30 are attached to opened portions in the solder resist 28.

While FIG. 4 illustrates the case where the electronic component (e.g. IC chip, etc.) is embedded facing upwards, the present invention is not limited to a direction in which the electronic component is embedded, and it is obvious that the electronic component (e.g. IC chip, etc.) can be embedded facing the solder balls, as in FIG. 5, according to the position of the cavity.

Also, while FIGS. 4 and 5 illustrate the cases where a cavity is formed to adjust the heights of the embedded electronic component and the core layer, it is obvious that, depending on the type and thickness of the material used in the stacking, an alternative process of mounting the electronic component directly on a surface of the metal substrate, i.e. the core member, may be used instead as in FIG. 6, without forming a cavity.

According to aspects of the present invention composed as set forth above, a metal substrate, such as that of aluminum, etc., is rendered electrically insulating by applying an anodizing process and is used as a core member in a printed circuit board, so that bending stiffness and heat-releasing property are improved; wet etching can be applied, so that manufacturing costs are reduced; and a chip bond adhesive high in thixotropy is used in embedding the electronic component, so that the positioning of the electronic component is improved.

Also, expensive supplies, such as tape and encapsulant, etc., required in the conventional embedding of electronic components are made unnecessary, so that costs may be reduced, and by utilizing a metal substrate having superior stiffness, the printed circuit board is made thin and highly reliable, and is provided an improved heat-releasing property.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a multi-layer printed circuit board using a metal substrate as a core member and having an electronic component embedded in the metal substrate, the method comprising:

anodizing the metal substrate such that an anodic oxide layer is formed on upper and lower sides of the metal substrate, respectively;

forming an inner layer circuit on upper and lower anodic oxide layers, respectively;

etching the metal substrate to form a cavity in correspondence with a position where the electronic component is to be embedded;

mounting the electronic component in the cavity with a chip bond adhesive; and forming an outer layer circuit on upper and lower sides of the metal substrate, respectively, such that a multi-layer circuit is formed and the metal substrate is positioned at a center portion of the printed circuit board.

2. The method of claim 1, wherein the metal substrate includes a material which can be made electrically insulating.

3. The method of claim 2, wherein the metal substrate includes at least one of aluminum (Al), magnesium (Mg), and titanium (Ti).

4. The method of claim 1, wherein the etching the metal substrate is performed by wet etching.

5. The method of claim 1, further comprising cleaning at least one surface of the metal substrate, before the anodizing.

6. The method of claim 1, wherein the chip bond adhesive includes a thixotropic material.

7. The method of claim 6, wherein the chip bond adhesive includes $SiO_2$ as a filler.

8. The method of claim 1, wherein the mounting the electronic component in the cavity with the chip bond adhesive comprises heating the metal substrate to harden the chip bond adhesive.

9. A multi-layer printed circuit board having an embedded electronic component, the printed circuit board comprising:

a metal substrate having a cavity formed therein;

anodic oxide layers formed on upper and lower surfaces of the metal substrate;

inner layer circuits formed on upper and lower anodic oxide layers;

an electronic component mounted in the cavity with an adhesive; and outer layer circuits formed on upper and lower sides of the metal substrate such that a multi-layer circuit is formed, wherein the metal substrate is positioned at a center portion of the printed circuit board.

10. The multi-layer printed circuit board of claim 9, wherein the cavity is formed by wet etching the metal substrate.

11. The multi-layer printed circuit board of claim 9, wherein the metal substrate includes a material which can be made electrically insulating.

12. The multi-layer printed circuit board of claim 9, wherein the metal substrate includes at least one of aluminum (Al), magnesium (Mg), and titanium (Ti).

13. The multi-layer printed circuit board of claim 9, wherein the adhesive includes a thixotropic material.

14. The multi-layer printed circuit board of claim 13, wherein the adhesive includes $SiO_2$ as a filler.

15. The multi-layer printed circuit board of claim 9, wherein the electronic component is joined by heating the metal substrate to harden the adhesive.

* * * * *

UNITED STATES PATENT AND TRADEMARK OFFICE
CERTIFICATE OF CORRECTION

| | | |
|---|---|---|
| PATENT NO. | : 7,947,906 B2 | Page 1 of 1 |
| APPLICATION NO. | : 11/528322 | |
| DATED | : May 24, 2011 | |
| INVENTOR(S) | : Doo-Hwan Lee et al. | |

It is certified that error appears in the above-identified patent and that said Letters Patent is hereby corrected as shown below:

First Page, Column 1, Item 75 (Inventors), Line 5, Delete "Daeleon (KR);" and insert -- Daejeon (KR); --, therefor.

Signed and Sealed this
Thirtieth Day of August, 2011

David J. Kappos
*Director of the United States Patent and Trademark Office*